United States Patent [19]
Asai et al.

[11] Patent Number: 5,514,605
[45] Date of Patent: May 7, 1996

[54] FABRICATION PROCESS FOR COMPOUND SEMICONDUCTOR DEVICE

[75] Inventors: Shuji Asai; Michihisa Kohno, both of Tokyo, Japan

[73] Assignee: NEC Corporation, Japan

[21] Appl. No.: 516,292

[22] Filed: Aug. 17, 1995

[30] Foreign Application Priority Data

Aug. 24, 1994 [JP] Japan .................................... 6-222585

[51] Int. Cl.$^6$ ............................................. H01L 21/8232
[52] U.S. Cl. .............................. 437/40; 437/56; 437/133; 437/912
[58] Field of Search ........................ 437/40 LC, 40 SH, 437/41 LC, 41 SH, 133, 56, 912, 234

[56] References Cited

U.S. PATENT DOCUMENTS

| | | | |
|---|---|---|---|
| 4,615,102 | 10/1986 | Suzuki et al. | 437/65 |
| 4,733,283 | 3/1988 | Kuroda | 257/195 |
| 5,021,857 | 6/1991 | Suehiro | 257/194 |
| 5,104,825 | 4/1992 | Takikawa | 437/133 |
| 5,356,823 | 10/1994 | Mitani | 437/40 SH |
| 5,409,849 | 4/1995 | Kishita et al. | 437/40 LC |
| 5,411,903 | 5/1995 | Wu et al. | 437/133 |

OTHER PUBLICATIONS

H. Suehiro, et al., "A New Recessed–Gate Structure for Short–Gate HEMT ICs", Japan Electronic Information Communication Engineering Institute, vol. 89, No. 366, ED89–133, 1990, pp. 29–34.

Primary Examiner—Tom Thomas
Assistant Examiner—Michael Trinh

[57] ABSTRACT

On a semi-insulative GaAs substrate, a channel layer, an electron supply layer, a threshold voltage controlling layer, an etching stop layer, a contact layer and an insulation layer are grown. By etching the insulation layer, gate openings are formed in an E-type element region and a D-type element region. With taking the gate opening as mask, dry etching is performed for the contact layer to form openings. On the inner periphery of the openings, side wall insulation layers are formed. With masking the gate opening in the D-type element region, and with taking the side wall insulation layer as mask, the etching stop layer is etched by wet etching, and threshold voltage controlling layer is etched by isotropic dry etching. After formation of the gate electrodes, source and drain electrodes are formed. By this, damaging of crystal upon formation of recess portion by etching is eliminated to prevent degradation of characteristics. Also, a source resistance can be lowered.

5 Claims, 8 Drawing Sheets

FABRICATION PROCESS FOR COMPOUND SEMICONDUCTOR DEVICE

BACKGROUND OF THE INVENTION

1. Field of the Invention

The present invention relates to a fabrication process of a compound semiconductor device including two kinds of field effect transistors (FETs) of an enhancement (E) type and a depletion (D) type, which employs a compound semiconductor layer or a two-dimensional electron gas (2DEG) layer as channels.

2. Description of the Related Art

Compound semiconductor, typically GaAs, is characterized by superior electron mobility in comparison with Si. In the recent years, application of a hetero-junction FET (HJFET) utilizing a high electron mobility of 2DEG generated at an interface between stack of different kinds of compound semiconductor layers grown by epitaxial growth method, for digital integrated circuit have been actively developed. In particular, for high signal speed/power consumption performance ratio, such technology has been expected to be applied in a small-size computers, communication field and so forth.

Since mobility of p-type carrier is low in comparison with n-type in the compound semiconductor, only n-type is employed in the integrated circuit. Generally, the integrated circuit comprises two kinds of FETs, i.e. an E-type FET having a positive gate threshold voltage ($V_T$) and a D-type FET having a negative gate threshold voltage. As a basic inverter circuit, a direct coupled FET logic (DCFL) is mainly employed. In this case, the E-type FET is used as a drive element and the D-type FET is used as a load element.

As a fabrication process of such FET, a selective etching recess method, in which a etching stop layer is provided within the epitaxial grown crystal layer for controlling an etching stop position, has been known.

Technical Study Report of Electronic Device, "Speeding of Short Gate HEMT IC with New Recess Gate Structure", Japan Electronic Information Communication Engineering Institute, ED89–133, pp 29–34 (1990) proposes a technology for improvement of performance of E-type FET (hereinafter, this proposal will be referred to as "first prior art"). Hereinafter, the first prior art will be discussed with reference to FIGS. 1 to 3. It should be noted that, among these drawings, FIG. 3 shows the element structure as proposed in the above-identified report, and FIGS. 1 and 2 illustrate element structures as background for the element structure of FIG. 3.

Figure 1:
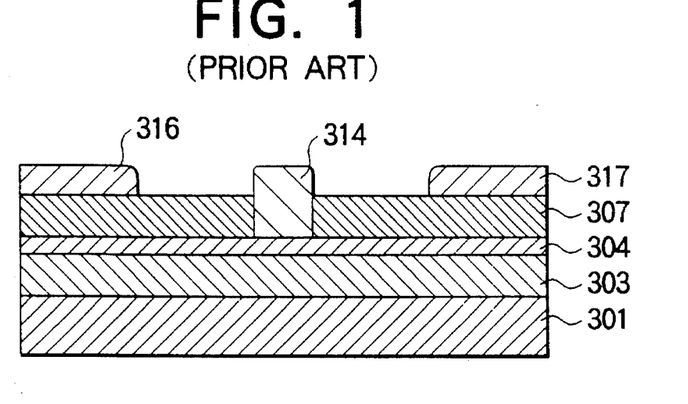
FIG. 1 is a section of a compound semiconductor device for explaining the first prior art.

FIG. 1 is a section of a normal recess-gate type FET. On a semi-insulative GaAs substrate 301, a channel layer (undoped GaAs) 303, an electron supply layer (n-type AlGaAs) 304, and a contact layer (n-type GaAs) 307 are deposited in order by epitaxial growth process. A gate electrode 314 is in contact with the electron supply layer 304 buried in the contact layer 307. On the contact layer 307 at both sides of the gate electrode 314, a source electrode 316 and a drain electrode 317 are formed.

In the shown structure, by increasing thickness of the contact layer 307, a source resistance $R_s$ can be lowered and a mutual conductance $g_m$ can be improved. However, on the other hand, when the thickness of the contact layer 307 is increased, contact area of the gate electrode 314 and the contact layer 307 is inherently increased to cause increasing of gate parasitic capacity. Also, in such case, gate leak current is increased to lower gate voltage and whereby lower margin of operation in the logic circuit. For reducing the gate parasitic capacity and for improving the gate voltage, the thickness of the contact layer 307 is to be reduced. However, in such case, source resistance $R_s$ is increased to lower the mutual conductance $g_m$.

Figure 2:
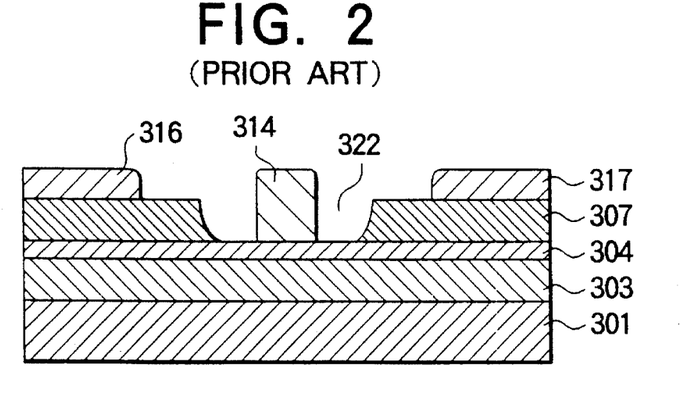
FIG. 2 is a section of a compound semiconductor device for explaining the first prior art.
Figure 3:
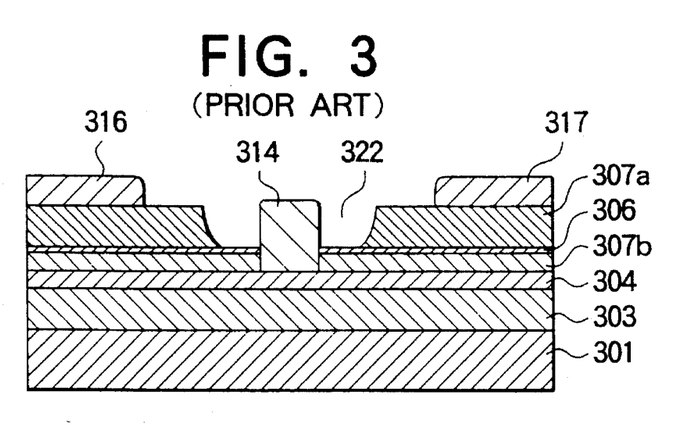
FIG. 3 is a section of a compound semiconductor device improvement for the compound semiconductor devices of FIGS. 1 and 2, for explaining the first prior art.

On the other hand, in the D-type FET, a structure as shown in FIG. 2, in which a gap 322 is defined by side etching of the contact layer 307 at both sides of the gate electrode 314 is employed for reduction of the source resistance $R_s$ and for improving gate parasitic capacity. However, if this structure is directly applied for the E-type FET, a depletion layer extending from the semiconductor surface of the gap 322 to a channel layer 303 is formed to cut the channel to make the FET inoperative.

Therefore, in the E-type element, there has been developed a structure which can improve both of the parasitic capacity and the gate voltage. The structure is a two-state recess structure of the element as illustrated in FIG. 3, shown in a form of cross-section.

In the E-type element, the contact layer is divided into an upper contact layer 307a and a lower contact layer 307b. In the upper contact layer 307a, a gap 322 is provided so that the gate electrode 314 may not contact with the upper contact layer 307a. On the other hand, the lower contact layer 307b is in contact with the side surface of the gate electrode 314. The layer thickness of the lower contact layer 307b is selected so that a depletion layer may not reach the channel layer 303. With this structure, the E-type element can operate. In the two-state recess structure, in comparison with the thickness of the lower contact layer 307b, the thickness of the upper contact layer 307a is sufficiently greater to make it possible to make the source resistance $R_s$ sufficiently small without causing degradation of the gate parasitic capacity and the gate voltage.

The E-type FET with the two-state recess structure is fabricated through the following process. At first, on the semi-insulative GaAs substrate 301, the undoped GaAs layer is formed as a channel layer 303, the n-type AlGaAs layer as the electron supply layer 304, the n-type GaAs layer as the lower contact layer 307b, an n-type AlGaAs layer as the etching stop layer 306, and n-type GaAs layer as the upper contact layer 307a are deposited in order by epitaxial growth method.

Then, an insulation layer (not shown) which serves as a spacer is formed on the deposited layers. Then, a photoresist layer (not shown) which has an opening above a gate portion is formed on the insulation layer. Then, the insulation layer is selectively etched with taking the photoresist layer as a mask.

Subsequently, by isotropic dry etching having selectivity for AlGaAs, the upper contact layer 307a is selectively etched to form a recess on the epitaxial substrate. At this time, by controlling over-etching amount, the size of the gap 322 is adjusted. Then, removing the etching stop layer 306, etching is performed for the lower contact layer 307b by a selective anisotropic dry etching employing a mixture gas of $CCl_2F_2$ and He. At this time, selection ratio of AlGaAs and GaAs can be made greater than or equal to 200. Then, the gate electrode is formed by way of a lift off method.

On the other hand, Japanese Unexamined Patent Publication (Kokai) No. Heisei 2-148740 proposes a fabrication process for forming E-type and D-type elements on a common substrate (hereinafter, the proposed construction and the fabrication process in the above-identified publication will be referred to as "second prior art"). Hereinafter, the second prior art will be discussed with reference to FIGS. 4 to 7 which are sections showing the fabrication process proposed in Japanese Unexamined Patent Publication No. Heisei 2-148740.

Figure 4:
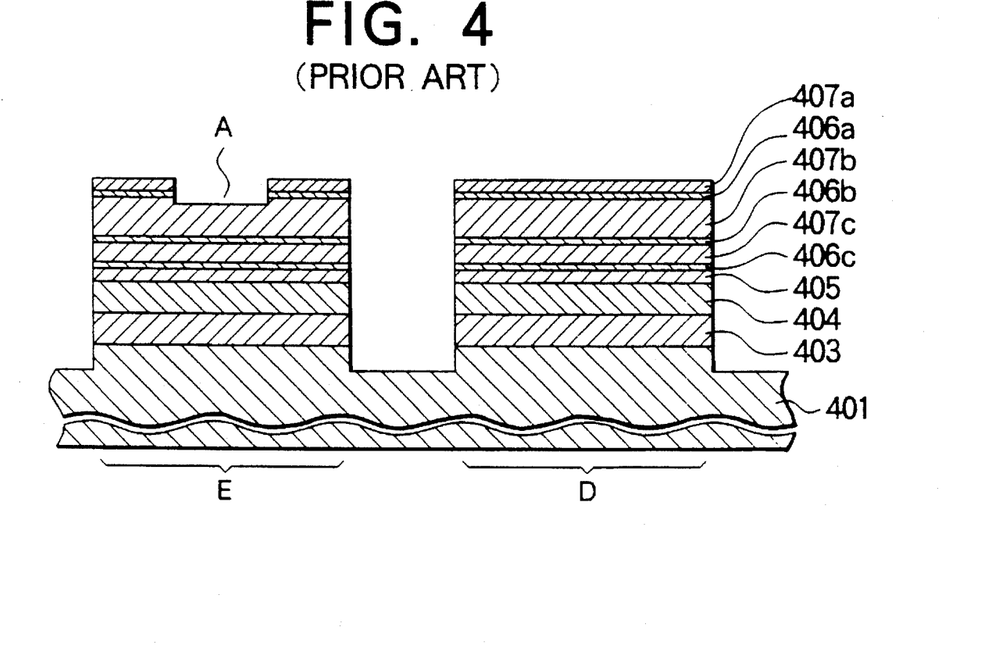
FIG. 4 is a section showing one process step of the fabrication process of the compound semiconductor device, for explaining the second prior art.

(1) As shown in FIG. 4, by a molecular beam epitaxy (MBE) method or a metal organic chemical vapor deposition (MOCVD) method, an undoped GaAs layer as a channel layer 403 in a thickness of 500, an n-type AlGaAs layer as an electron supply layer 404 in a thickness of 30, an n-type GaAs layer as a threshold voltage controlling layer 405 for adjusting a gate threshold voltage in the depletion-type transistor in a thickness of 10, an n-type AlGaAs layer as a third etching stop layer 406c in a thickness of 5 nm, an n-type GaAs layer as a third contact layer 407c in a thickness of 15, an n-type AlGaAs layer as a second etching stop later 406b in a thickness of 5 nm, an n-type GaAs layer as a second contact layer 407b in a thickness of 60 nm, an n-type AlGaAs layer as a first etching stop layer 407a in a thickness of 5 nm and an n-type GaAs layer as a first contact layer 406a are grown on a semi-insulative GaAs substrate 401. Respective of n-type AlGaAs layers and n-type GaAs layers have a common donor density of $2 \times 10^{18}$ cm$^{-3}$.

Mesa etching is then performed by a wet etching method employing a hydrogen fluoride type etching liquid as enchant for isolation between elements. Also, element isolation may also be performed by ion implantation method.

The first contact layer 407a (n-type GaAs) and first etching stop layer 406a (n-type AlGaAs) in the E-type element are selectively etched with taking the photoresist as a mask to form a recess A.

Figure 5:
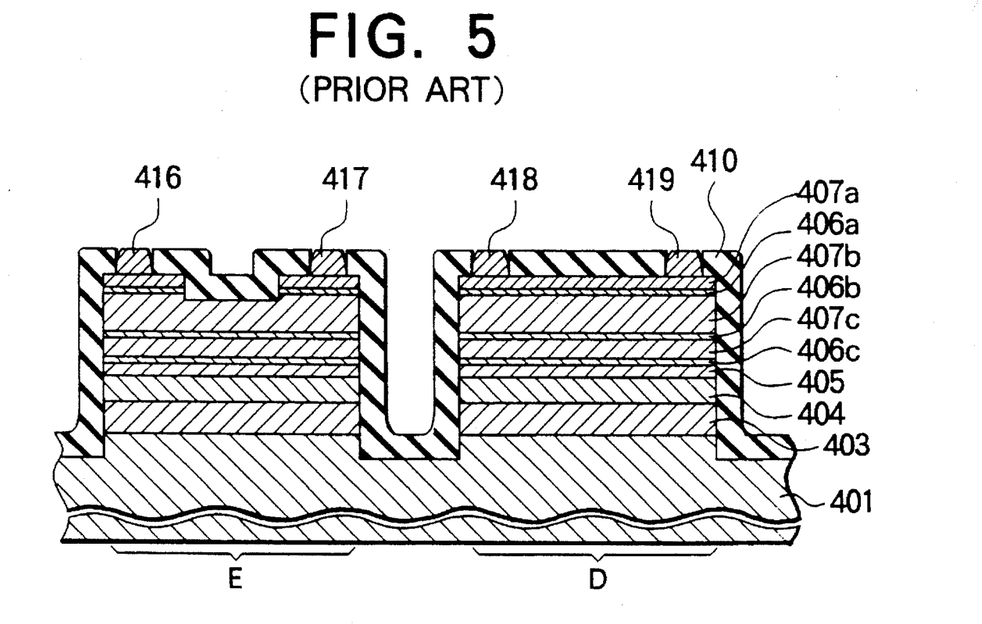
FIG. 5 is a section showing a step subsequent to the process step of FIG. 4, for explaining the second prior art.

(2) Subsequently, as shown in FIG. 5, as a SiO$_2$ layer as an insulation layer 410 is grown on the entire surface in a thickness of approximately 300 nm. With taking the photoresist as a mask, opening is formed in the insulation layer 410 to form ohmic source electrodes 416 and 418 and drain electrodes 417 and 419 by a lift off method.

Figure 6:
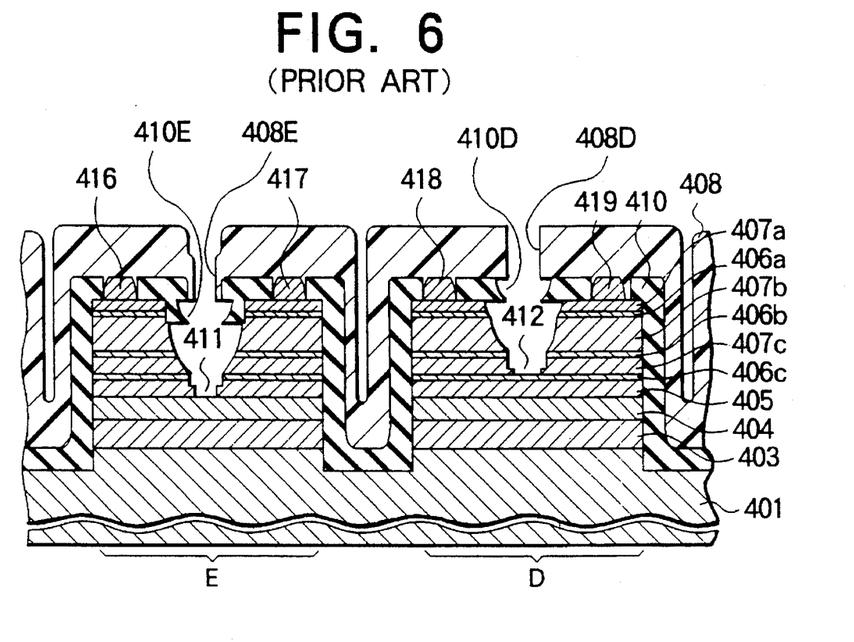
FIG. 6 is a section showing a step subsequent to the process step of FIG. 5, for explaining the second prior art.

(3) Subsequently, as shown in FIG. 6, a photoresist layer 408 having openings 408E and 408D for forming respective gate electrodes in the E-type and D-type element regions is formed. With taking the photoresist layer 408 as a mask, openings 410E and 410D are formed in the insulation layer 410 by a wet etching method employing a hydrogen fluoride type etching liquid or a RIE method employing a carbon fluoride type gas.

Thereafter, by application of RIE method under the condition of etching gas: CCl$_2$F$_2$, pressure: 20 Pa, self-bias voltage: 30 V, isotropic etching is performed for n-type GaAs layers (second contact layer 407b and the first contact layer 407a) of respective of the E-type and D-type elements. At this time, the n-type AlGaAs layers beneath respective n-type GaAs layers 407b and 407a (i.e. the second etching stop layer 406b and the first etching stop layer 406a) serve as stoppers.

Subsequently, by etching the etching stop layers 406b and 406a exposed by hydrogen fluoride type enchant, the n-type GaAs layers (third contact layer 407c and the second contact later 407b) below the etching stop layers 406b and 406a are exposed.

Thereafter, by application of RIE method under the condition of etching gas: CCl$_2$F$_2$, pressure 20 Pa and self-bias voltage: 30 V, isotropic dry etching is performed for the third contact layer 407c and the second contact layer 407b to expose the surfaces of the n-type AlGaAs layers (third etching stop layer 406c and the second etching stop later 406b) respectively located below the third contact layer 407c and the second contact layer 407b. Subsequently, similarly to the former case set forth above, by performing etching for the third and second etching stop layers 406c and 406b employing the hydrogen fluoride type etchant, the surfaces of the n-type GaAs layers (threshold valve controlling layer 405 and third contact layer 407c) located below the third and second etching stop layers 406c and 406b are exposed.

Thereafter, application of RIE method under a condition of etching gas: CCl$_2$F$_2$, lowered pressure: 5 Pa, and elevated self-bias: 100 V, anisotropic dry etching is performed for the threshold valve controlling layer 405 and third contact layer 407c to form gate openings 411 and 412. Etching is stopped at the n-type AlGaAs layer (electron supply layer 404 and third etching stop layer 406c) respectively located below threshold valve controlling layer 405 and third contact layer 407c (FIG. 6).

Figure 7:
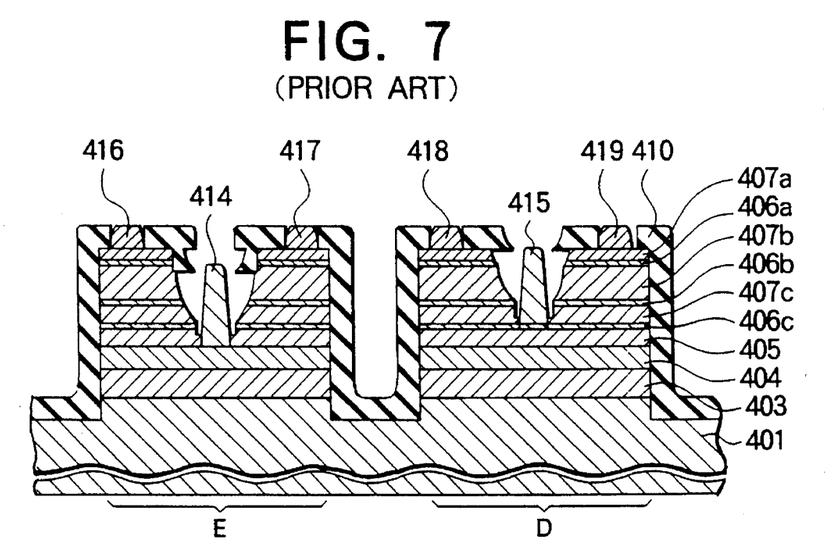
FIG. 7 is a section showing a step subsequent to the process step of FIG. 6, for explaining the second prior art.

(4) Subsequently, as shown in FIG. 7, by employing the remained photoresist layer 408, Schottky junction type gate electrodes 414 and 415 are formed by aluminum in the thickness of 400 nm in respective gate openings 411 and 412 to complete fabrication of the E-type and D-type elements.

Through etching of the epitaxially deposited layers, in the E-type element region, etching of the crystal layer is advanced relative to the D-type element region in the extent of the recess A formed in the initial process of (1). Therefore, finally, the electron supply layer 404 is exposed in the E-type element, whereas the third etching stop layer 406c above the threshold valve controlling layer 405 is exposed in the D-type element region.

When the gate electrodes are formed, respective gate electrodes of the E-type and D-type elements are buried within the thin threshold valve controlling layer 405 and the third contact layer 407c. Therefore, reduction of the source resistance $R_s$ of the E-type element and improvement in the gate voltage at the D-type element. Furthermore, a gate parasitic capacitor can be reduced.

On the other hand, the task of the compound semiconductor integrated circuit device is, in formation of the E-type and D-type elements on the common substrate:

(1) to assure to have sufficient mutual conductance $g_m$ by reducing the source resistance;

(2) to assure to provide sufficient tolerance voltage, such as gate breakdown voltage;

(3) to reduce the parasitic capacity; and (4) to be able to be fabricated easily and stably.

are to be satisfied. However, in the fabrication process of the foregoing (1), (2) and (3), the number of crystal for achieving (1), (2) and (3) becomes nine and the structure becomes more complicate. Furthermore, after initial etching for the E-type element region, it becomes necessary to perform crystal dry etching for three times. Therefore, large number of steps becomes large to make the fabrication process more complicate.

Also, in the foregoing first and second prior arts, after isotropic crystal etching, the crystal surfaces located way from the mask are treated by chemical etching by the anisotropic etching. However, gas component of Cl to be employed in the crystal etching has a chemically high tendency of isotropic etching, anisotropy cannot be enhanced unless the gas pressure is lowered to raise the self-bias voltage. However, in such measure, strong damage may be given for the lower crystal layer to lower carrier density and mobility.

On the other hand, by lightening anisotropy, etching can be progressed in the lateral direction to make the gate electrode and the contact layer kept isolated and thus the desired buried gate structure cannot be achieved, and the source resistance is increased to lower the mutual conductance $g_m$. Furthermore, the etching condition may be varied detecting upon the pattern density, configuration and so forth, precision of the distance between the gate electrode and the contact layer region in the case where the gate cannot be buried becomes insufficient, to make fluctuation of characteristics in the wafer or between wafers significant.

Furthermore, in the conventional fabrication process, crystal dry etching is progressed with taking the gate opening pattern of the initially formed photoresist layer as the mask, and the photoresist layer is used until lift-off formation of the gate electrode. However, the photoresist layer is etched out to widen the opening of the photoresist layer, final gate length dimension becomes greater to lower the precision. Also, for unstability of the gate length, it is undesirable in view of high frequency characteristics.

SUMMARY OF THE INVENTION

It is an object of the present invention to enhance productivity with simplified structure of the semiconductor device.

Another object of the invention is to obtain sufficient precision even when anisotropic etching is not performed for etching of the final epitaxial layer, thereby preventing to avoid lowering of performance by performing anisotropic etching.

A further object of the invention is to avoid repeated used of the photoresist as mask in progressing etching to accurately form a gate contact hole and to improve burying ability of the gate electrode to lower the source resistance $R_s$ and improvement of reproductivity.

According to one aspect of the invention, a fabrication process of a compound semiconductor device comprises:

a first step of sequentially growing a first conductive semiconductor layer group, a second conductive semiconductor layer group and a low resistance conductive semiconductor layer on a semi-insulative semiconductor substrate in order;

a second step of forming a first insulation layer on the low resistance conductive semiconductor layer and forming first and second gate openings by selectively etching the first insulation layer;

a third step of selectively etching the low resistance conductive semiconductor layer exposed by the first and second gate openings formed in the first insulation layer to expose the surface of the second conductive semiconductor layer group to form third and fourth gate openings continuous to the first and second gate openings;

a fourth step of forming a side wall insulation layer in the side wall of the first to fourth gate openings by depositing second insulation layer on entire surface and by etching back the second insulation layer;

a fifth step of selectively etching the second conductive semiconductor layer group exposed through the third gate opening with masking the second and fourth gate openings to expose the surface of the first conductive semiconductor layer group to form a fifth gate opening continuous to the third gate opening; and a sixth step of forming a first gate electrode contacting with the surface of the first conductive semiconductor layer group via the first, third and fifth gate openings and with the side surface of the second conductive semiconductor layer group, and a second gate electrode contacting with the second conductive semiconductor layer group via the second and fourth gate openings.

The second conductive semiconductor layer group may include a threshold value voltage controlling layer in a thickness less than or equal to 15 as a lower layer, and an etching stop layer for stopping etching upon etching of the lower resistance conductive semiconductor layer as an upper layer, and the fifth step may include a selective etching step for the etching stop layer and an isotropic dry etching step for the threshold voltage controlling layer. In the alternative, the fifth step may include a selective etching step for the etching stop layer and an etching step for the threshold voltage controlling layer performed by generating a plasma by an electron cyclotron resonance.

The etching stop layer may be an AlGaAs layer, and the threshold voltage controlling layer may be an GaAs layer.

The compound semiconductor device, to which the present invention is applicable, has two stage buried gate in the E-type element and a single stage buried gate in the D-type element. The E-type element has the gate electrode buried in contact with the second conductive semiconductor layer group for adjusting threshold voltage of the D-type element. By this arrangement, channel shut off between the electrodes due to surface depletion layer can be successfully avoided, and the source resistance $R_s$ can be suppressed to prevent the mutual conductance g from being lowered.

On the other hand, while, in case of the D-type element, the channel between the electrodes may not be shut off completely, if the gate threshold voltage is close to 0 V, the source resistance $R_s$ may be increased. However, if the interval between the electrodes is narrow, extension of the surface depletion layer can be suppressed by ballistic effect where the electron is excited to run and two-dimensional effect where the electron is excited to spread, and increasing of the source resistance can be suppressed. Therefore, in the compound semiconductor device according to the present invention, in order to narrow the interval between the gate electrode and the contact conductive layer, the side wall insulation layer formation technology has been employed. Thus, by the present invention, lowering of the source resistance and suppression of fluctuation of the source resistance can be suppressed.

In the fabrication process according to the present invention as defined above, an isotropic etching is employed as crystal dry etching. Here, the wording "isotropic etching" should mean an etching having small etching speed ratio in vertical and lateral direction when the layer thickness of the objective layer to be etched is sufficiently thick. Increasing of anisotropy in the crystal dry etching, is not desirable for higher possibility of damaging the crystal. In the present invention, etching for the threshold voltage controlling layer as the objective layer, is performed with taking the etching stop layer and the side wall insulation layer as masks. Therefore, it becomes unnecessary to provide high anisotropy, and thus damaging of the crystal layer can be restricted. Also, by setting the layer thickness of the threshold voltage controlling layer below the opening of the side wall insulation layer to be thin in the extent of less than or equal to 15, the etching amount in the lateral direction can be made smaller even with the isotropic etching. In particular, as ECR (electron cyclotron resonance) is employed as dry etching technology, damaging of the crystal can be further reduced and the etching in the lateral direction can be completely suppressed.

Furthermore, in the fabrication process according to the present invention, after transferring a pattern of the gate opening on the insulation layer, such as SiO₂, having high etching resistance to a gas, such as Cl or F, which is used in the crystal dry etching, or after narrowing the gate opening by the side wall insulation layer, etching is progressed with taking these as mask. Therefore, different from the case where the etching is progressed with taking the photoresist layer as mask, problems to cause enlarging of the gate length and fluctuation of the gate length can be successfully avoided. Namely, by the present invention, the management of the gate length which is important in the fabrication process of this type of the compound semiconductor device, can be significantly simplified.

On the other hand, the crystal growth layer of the compound semiconductor device can be simplified with the first conductive semiconductor layer, the second conductive semiconductor device and the contact layer. Therefor, the fabrication process permits production of the E/D-type semiconductor device only by two steps of crystal dry etching. Therefore, the production steps can be simplified.

As set forth above, the compound semiconductor device according to the present invention employs the two stage recess buried gate structure in the E-type element and a single recess gate structure in the D-type element, and isolation between respective gate electrode and the contact conductive layer may be established by the side wall insulation layer. Therefore, the E-type and D-type compound can be realized with simple construction to facilitate fabrication process. Namely, in the conventional E-type and D-type compound semiconductor device, it has been required 10 layers grown by the epitaxial growth method, and in addition, inherently required to have 4 times of dry crystal treatment. In case of the present invention, the compound device may be formed 6 to 7 times of epitaxial growth method and 2 times of dry crystal treatment.

On the other hand, the pattern formed in the photoresist is transferred to SiO₂ layer which has high resistance against dry etching of GaAs to progress etching from the crystal. Also, since the dimension of the gate opening is determined by the thickness of the side wall insulation layer having high etching resistance, the gate electrode of the E-type and D-type elements which is important in managing the gate length, can be formed with high precision.

On the other hand, particularly in the D-type element, the gate electrode and contact layer can be isolated by the thin side wall insulation layer, the source resistance which is the important characteristics can be lowered and the mutual conductance $g_m$ can be improved.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail with reference to the drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

First Embodiment

Figure 8:
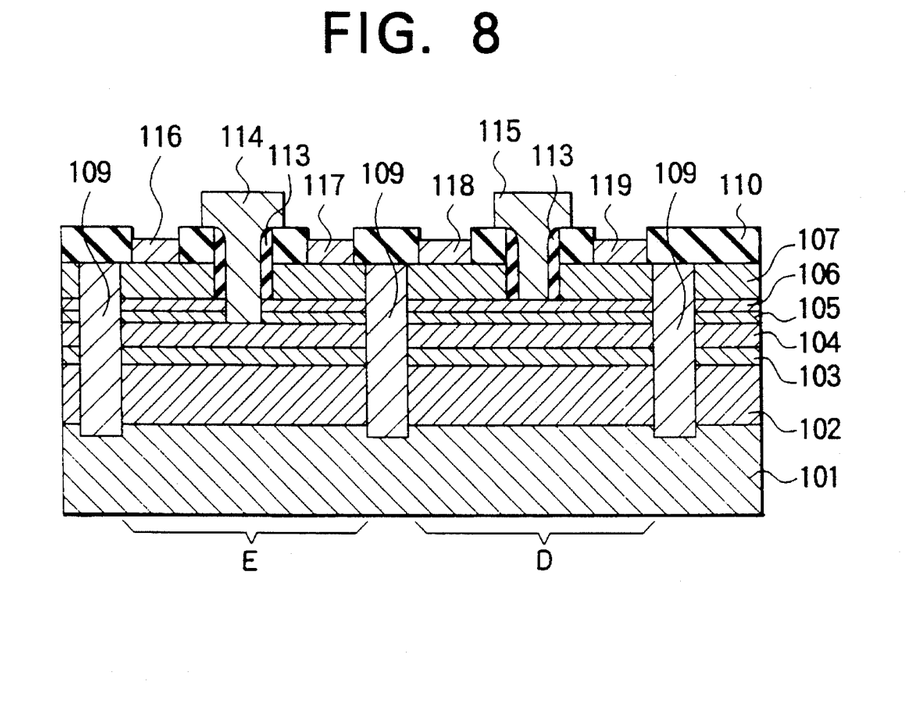
FIG. 8 is a section of a compound semiconductor device for explaining the first to third embodiments of the present invention.

FIG. 8 is a section showing a construction of the first embodiment of a compound semiconductor device according to the present invention. In the shown embodiment, on a semi-insulative GaAs substrate 101, the following epitaxial layers are grown:

as a buffer layer 102, undoped GaAs layer in 400 nm thickness;

as a channel layer 103, undoped $In_{0.85}Ga_{0.85}As$ layer in 15 thickness;

as an electron supply layer 104, n-type $Al_{0.20}Ga_{0.80}As$ layer in 30 thickness;

as a threshold voltage controlling layer 105, n-type GaAs layer in 4 nm thickness;

as an etching stop layer 106, n-type $Al_{0.20}Ga_{0.80}As$ in 3 nm thickness;

as a contact layer 107, n-type GaAs layer in 100 nm thickness, respective n-type layer having common donor density of $2 \times 10^{18}$ cm$^{-3}$.

Here, the channel layer 103 and the electron supply layer 104 correspond to a first conductive semiconductor layer group, and the threshold voltage controlling layer 105 and the etching stop layer 106 correspond to a second conductive semiconductor layer group.

An element isolation depletion layer 109 is formed by ion implantation for isolation between elements to form E-type and D-type element regions. In the D-type element, a Schottky type gate electrode 115 is in contact with the etching stop layer 106 of the second conductive semiconductor layer group and is isolated from the contact layer 107 by a side wall insulation layer 113 of $SiO_2$ in a thickness of 100 nm. In the E-type element, a gate electrode 114 is similarly isolated from the contact layer 107 by the side wall insulation layer 113. Also, the gate electrode 114 contacts with the side surfaces of the threshold valve controlling layer 105 and the etching stop layer 106 as the second conductive semiconductor layer group and to the electron supply layer 104 of the first conductive semiconductor layer group.

On the other hand, on the contact layer 107 of the E-type and D-type element region, ohmic source electrodes 116 and 118 and drain electrodes 117 and 119 are provided. The Schottky type gate electrodes 114 and 115 are formed of aluminum (Al) with 0.4 µm of gate length and 600 nm of thickness. The source and drain electrodes 116 to 119 are AuGeNi alloy layers. For formation of these electrodes, a field insulation layer 110 in a thickness of 300 nm of $SiO_2$ provided on the surface of epitaxial layer is utilized.

Next, discussion will be given for fabrication process of the shown embodiment. FIGS. 9 to 14 are sections showing process steps explaining the fabrication process.

(1) On the semi-insulative GaAs substrate 101, the buffer layer 102, the channel layer 103, the electron supply layer 104, the threshold voltage controlling layer 105, the etching stop layer 106 and the contact layer 107 are formed in order by epitaxial growth by way of MOCVD method. The composition, layer thickness and impurity concentration of respective layers are as explained with respect to FIG. 8.

Figure 9:
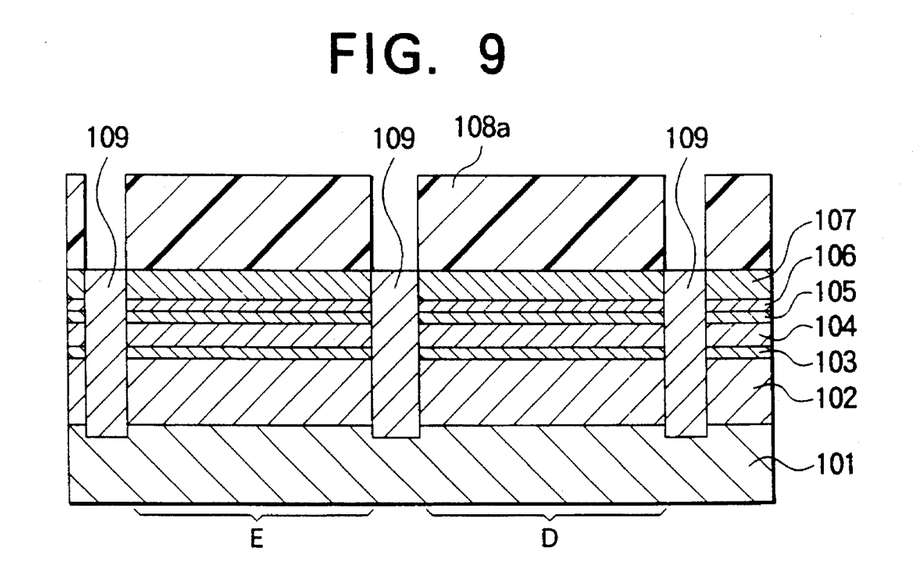
FIG. 9 is a section showing one process step for explaining a fabrication process of the compound semiconductor device shown in FIG. 8.

As shown in FIG. 9, with covering the element region, 2 µm in thickness of photoresist layer 108a, ion implantation is performed to form the element isolation void region 109 which isolates the element. The condition of ion implantation is an implantation ion: $^{11}$B+(boron ion), acceleration energy: 200 keV, implantation dose: $5 \times 10^{13}$ cm$^{2}$. Under this condition, a void is formed up to the interface between the buffer layer 102 and the semi-insulative GaAs substrate 101. Subsequently, the photoresist layer 108a is removed.

Figure 10:
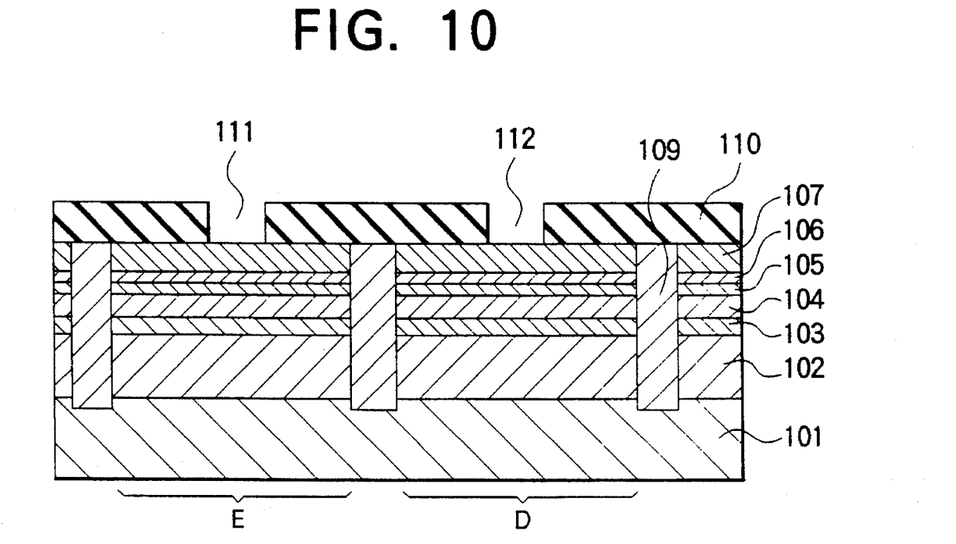
FIG. 10 is a section showing a process step subsequent to the step of FIG. 9 for explaining a fabrication process of the compound semiconductor device shown in FIG. 8.

(2) Next, as shown in FIG. 10, 300 nm thickness of $SiO_2$ as the field insulation layer 110 is grown on the surface of the substrate 101 and gate openings 111 and 112 are formed in the insulation layer 110. The method for forming the gate openings 111 and 112 is that, with forming a photoresist layer pattern, the openings are formed in the field insulation layer 110 by RIE method employing $CF_4$ gas under a condition of pressure: 10 Pa and a self-bias voltage: 30 V, and the photoresist layer is removed after formation of the openings 111 and 112.

Figure 11:
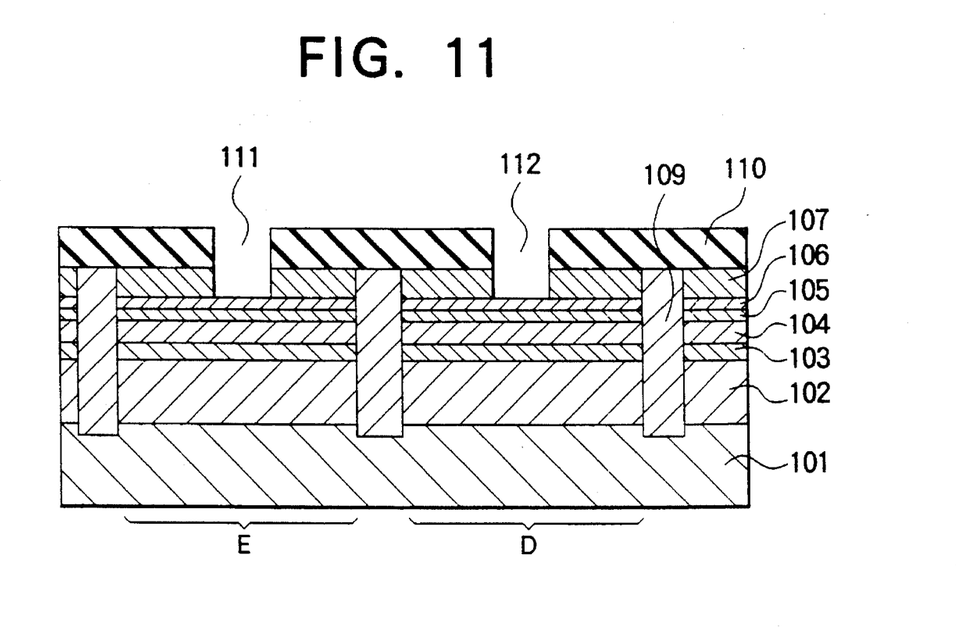
FIG. 11 is a section showing a process step subsequent to the step of FIG. 10 for explaining a fabrication process of the compound semiconductor device shown in FIG. 8.

(3) Next, as shown in FIG. 11, with taking the field insulation layer 110 having the gate openings 111 and 112 provided on the surface of the epitaxial layer as mask, selective dry etching is performed by RIE method employing $CCl_2F_2$ gas for the contact layer (n-type GaAs layer) 107 to expose the surface of the etching stop layer 106 (n-type AlGaAs layer). RIE condition is pressure: 20 Pa and the self-bias: 30 V. The selection ratio of GaAs layer with respect to AlGaAs and $SiO_2$ layers is greater than or equal to 200 times, under the condition set forth above. Subsequently, cleaning of the crystal surface is performed by oxygen plasma and organic washing.

Figure 12:
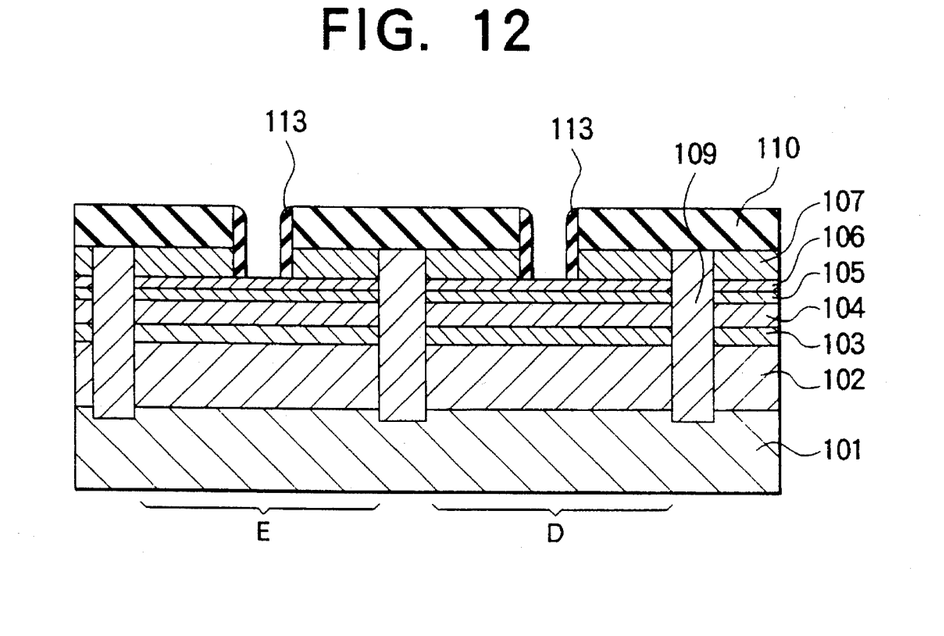
FIG. 12 is a section showing a process step subsequent to the step of FIG. 11 for explaining a fabrication process of the compound semiconductor device shown in FIG. 8.

(4) Next, as shown in FIG. 12, 200 nm thickness of $SiO_2$ is formed on the surface of the etching stop layer 106. Then, anisotropic etching is performed by way of RIE method employing $CF_4$ gas to form a side wall insulation layer 113. The RIE condition is pressure: 10 Pa and self-bias voltage: 30 V. The thickness of the side wall insulation layer after treatment is approximately 100 nm owing to layer formation ability of the side surface and etching of the lateral direction. Subsequently, the crystal surface is cleaned by oxygen plasma and organic washing.

Figure 13:
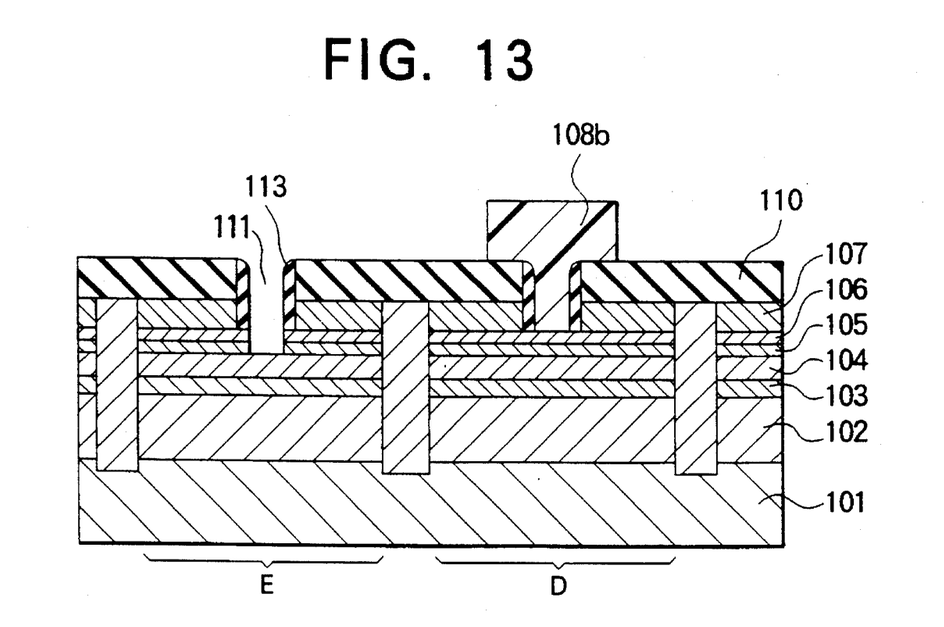
FIG. 13 is a section showing a process step subsequent to the step of FIG. 12 for explaining a fabrication process of the compound semiconductor device shown in FIG. 8.

(5) Next, as shown in FIG. 13, the gate opening 112 of the D-type element region is covered with a photoresist layer 108b, and the etching stop layer 106 (3 nm thickness of n-type AlGaAs layer) exposed through the gate opening 111 which is narrowed by the side wall insulation layer of the E-type element by a phosphoric acid-type etchant to expose the surface of the threshold valve controlling layer 105 (n-type GaAs layer). The etching condition at this time is, etchant: concentrated phosphoric acid: hydrogen peroxide solution: water=4:1:200, liquid temperature: 15°C., process period: 10 seconds.

For the exposed threshold voltage controlling layer 105, selective dry etching is performed with employing RIE method with $CCl_2F_2$ to expose the surface of the electron supply layer 104 (n-type AlGaAs) which also serves as etching stop layer. The RIE condition is pressure: 20 Pa and self-bias voltage: 30 V. Subsequently, the photoresist layer 108b used as the mask is removed, and cleaning is performed for the crystal surface by oxygen plasma and organic washing.

This etching is normally the isotropic etching. However, since the threshold voltage controlling layer 105 is thin as 4 nm of layer thickness, few magnitude of etching is progressed in the lateral direction. Here, when the layer thickness of the threshold voltage controlling layer (n-type GaAs layer) 105 is less than or equal to 15, the etching in the lateral direction is suppressed in the extent to cause no practical problem. However, it is not desirable to make the layer thickness less than or equal to 1 nm. When the layer thickness is less than or equal to 1 nm, uniformity of formation of the layer and treatment cannot be ascertained.

Figure 14:
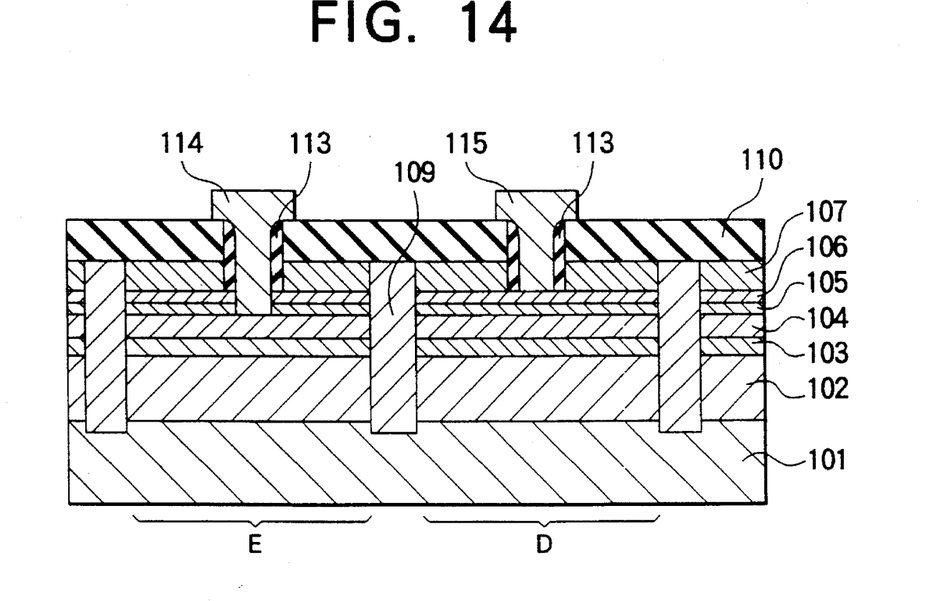
FIG. 14 is a section showing a process step subsequent to the step of FIG. 13 for explaining a fabrication process of the compound semiconductor device shown in FIG. 8.

(6) Next, as shown in FIG. 14, Schottky type metal to be the gate electrode: Al is grown on the entire surface by electron beam deposition in a thickness of 0.5 µm. At this time, by rotating the substrate base, deposition direction is varied to bury the metal within the opening. Next, with covering the photoresist layer in the vicinity of the gate opening, Al layer is patterned by RIE method employing $CCl_4$ gas to form the gate electrodes 114 and 115.

(7) Subsequently, on the contact layer (n-type GaAs) 107 of the element, photoresist layer having the opening in a form of pattern of the ohmic electrode to be formed, is provided. Then, field insulation layer ($SiO_2$) 110 is opened by a buffered hydrofluoric acid. Then, by deposition, lift-off and subsequent heat treatment at 430° C., source electrodes 116 and 117 and drain electrodes 117 and 119 of AuGeNi are formed. Then, the shown embodiment of the semiconductor device of FIG. 6 can be obtained.

Variation of size of the gate opening which corresponds to the gate length of the gate electrode at each process step has been measured by scanning type electron microscope (SEM). With respect to 20 wafers of 76 mm diameter, opening size of the photoresist exposed by i-ray stepper as initially measured was:

average: 0.53 μm, standard deviation σ: 0.017 μm, the opening dimension provided in the field insulation layer 110 was:

average: 0.58 μm, standard deviation σ: 0.013 μm, the opening dimension provided in the side wall insulation layer was:

average: 0.39 μm, standard deviation σ: 0.015 μm The accuracy in formation of opening of the field insulation layer can be maintained even after formation of the side wall insulation layer. Therefore, the gate length of the gate electrode can be maintained at high accuracy. Here, the reason for lower accuracy of opening of the photoresist layer than that of the field insulation layer is considered that charge-up on the $SiO_2$ layer upon measurement of the former makes the error in measurement greater.

The square-law characteristics K value [K value is a constant satisfying $I_{SAT}=K(V_G-V_T)^2$, maximum mutual conductance $g_m$ and threshold voltage $V_T$ of the E-type and D-type elements having 0.4 μm of gate length obtained through the fabrication process set forth above, were as follows:

E-type element: 500 mS/V mm, 430 mS/mm, +0.2 V,

D-type element: 340 mS/V mm, 360 mS/mm, −0.5 V.
Also, the gate peak inverse voltages and drain voltages in both elements were higher than or equal to 5 V. Therefore, they satisfy the condition to be elements for integrated circuit. The source resistance $R_s$ was 0.9 Ωmm in the E-type element and 0.6 Ωmm in the D-type element.

Comparative Example 1

Study has been made for the result of fabrication of the elements by the conventional fabrication process with employing the similar epitaxially grown substrate to the shown embodiment. However, in this case, formation of the gate electrodes of the E-type and D-type elements were performed through separated photoresist formation step and treatment step. In the process, 300 nm of $SiO_2$ layer was grown on the surface of the substrate, a photoresist layer having gate opening length of 0.4 μm was formed and opening was formed through the $SiO_2$ layer by hydrofluoric acid. Next, for the contact layer (n-type GaAs layer) 107, selective dry etching was performed by RIE method employing $CCl_2F_2$ gas to expose the surface of the etching stop layer (n-type AlGaAs layer) 106. The condition of RIE method was pressure: 20 Pa and self-bias voltage: 30 V, which was close to isotropy. In the D-type element, the gate electrode was subsequently formed by deposition of Al in the lift-off method.

In the E-type element, the photoresist layer of the gate opening was again formed, the opening of the $SiO_2$ layer was formed by buffered hydrofluoric acid, similarly to the case of the D-type element, selective dry etching was performed for the contact layer (n-type GaAs layer) 107 by RIE method with employing $CCl_2F_2$ gas to expose the surface of the etching stop layer (n-type AlGaAs layer) 106, and AlGaAs of the etching stop layer 106 was solved by the etchant of phosphoric acid and hydrogen peroxide solution. Subsequently, by employing $CCl_2F_2$, in anisotropy enhanced RIE method under the condition of pressure: 5 Pa, self-bias voltage: 100 V, the threshold voltage controlling layer (n-type GaAs layer) 105 was etched. Subsequently, a gate electrode was formed by lift-off method to form ohmic electrodes of the E-type and D-type elements.

The square-law characteristics K value, the maximum mutual conductance $g_m$ and the threshold voltage $V_T$ were as follows:

E-type element: 240 mS/V mm, 180 mS/mm, 2.4 Ωmm, +0.4 V

D-type element: 270 mS/V mm, 310 mS/mm, 0.7 mm, −0.6 V

Here, while the characteristics of the D-type element is substantially the same as that of the shown embodiment of the present invention, the source resistance $R_s$ is large, the K value and $g_m$ are small and $V_T$ is shallow in the E-type element. It is considered that this has been caused by enhancing anisotropy in the dry etching, damage was caused to degrade the semiconductor characteristics, such as carrier density, electron mobility and so forth.

Comparative Example 2

When the RIE condition for the E-type element is varied by increasing the pressure and lowering the self-bias voltage relative to the RIE condition in the foregoing comparative example 1, under the pressure of 8 Pa, when the self-bias voltage is lowered across 80 V, anisotropy is lowered to increase the etching rate in the lateral direction of the threshold valve controlling layer (GaAs) 105 exposed in the opening and to further etch GaAs in the contact layer 107. Therefore, in such case, the intended gate electrode cannot be buried.

It should be noted that the E-type element characteristics under the RIE condition of pressure: 20 Pa and self-bias voltage: 30 V to have the condition close to the isotropy, were as follows:

K value: 360 mS/V mm, $g_m$: 310 mS/mm, source resistance: 1.8 Ωmm, threshold voltage $V_T$: +0.2 V.
In comparison with the cause of the enhanced anisotropy, K value, $g_m$ and source resistance were improved, and $V_T$ was deep to suppress lowering of the carrier density associated with damaging, similarly to the shown embodiment of the invention. In this case, the reason why the K value, $g_m$ are low is considered for increasing of the source resistance since the gate electrode could not buried in the threshold voltage controlling layer.

Comparative Example 3

Next, the layer thickness of the electron supply layer (n-type AlGaAs layer) 104 in the E-type element was increased from 30. Then, treatment for the threshold voltage controlling layer was performed with RIE method with enhanced anisotropy. The K value, $g_m$, the source resistance $R_s$ and $V_T$ at this thickness were as follows:

35 nm: 260 mS/V mm, 230 mS/mm, 2.1 Ωmm, +0.2 V 40 nm: 300 mS/V mm, 310 mS/mm, 1.9 Ωmm, +0.0 V 45 nm: 330 mS/V mm, 360 mS/mm, 1.2 Ωmm, −0.vi

As can be seen from these results, when the electron supply layer was formed to be thicker, $V_T$ can be made deeper, no substantial improvement can be seen in the source resistance, K value and $g_m$. By the enhanced anisotropy, the damaging of the crystal degrades the element characteristics. Therefore, it should be appreciated that the characteristics achieved by the shown embodiment of the present invention cannot be obtained even by simply burying the gate electrode in the threshold valve controlling layer.

Second Embodiment

Next, discussion will be given for the second embodiment of the present invention. The section showing the construction of the shown embodiment of the compound semiconductor device and the fabrication process steps of the shown embodiment are similar to those of the first embodiment as illustrated in FIGS. 8 to 14. Therefore, these figures with be occasionally made reference to. In the shown embodiment, in place of the RIE method, ECR method dry etching utilizing electron cyclotron resonance is employed as less-damaging dry etching method.

Figure 15:
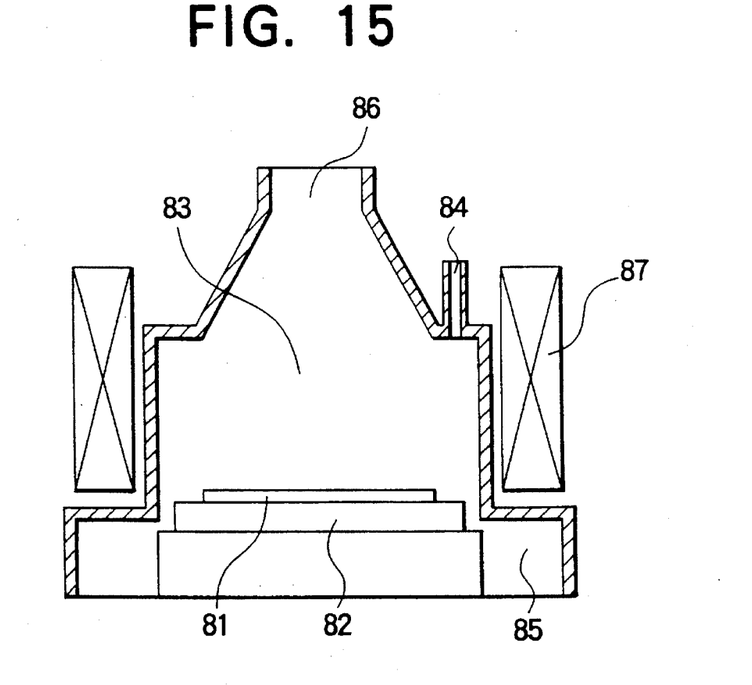
FIG. 15 is a general section of ECR etching device for explaining the second embodiment.

FIG. 15 is an illustration showing general section for explaining the ECR method dry etching device. A substrate 81 mounted on a sample base 82 is placed in contact with an etching chamber 83. The etching chamber 83 has an induction opening 84 and a discharge opening 85. A gas for etching is introduced through the induction opening 84 and discharged through the discharge opening 85. A microwave induction opening 86 is located just above the substrate 81, which introduces a 2.45 GHz of microwave to cause electron cyclotron resonance (ECR) to generate a plasma to perform etching. An electromagnetic coil 87 is provided on the outer periphery of the etching chamber 83 for adjusting magnetic field so that ECR plasma may be uniformly generated on the substrate 81. Since the self-bias voltage in etching step of such ECR method is smaller to be less than or equal to 20 V, lesser damage will be given for the semiconductor crystal in comparison with the RIE method.

In the shown embodiment, the process of (2) to (5) are modified as follows.

(2)' The field insulation layer 110 in FIG. 10 was processed to form the gate openings 111 and 112 with employing $SF_6$ gas under the condition of pressure: 0.1 Pa, microwave power: 200 W.

(3)' In the process step shown in FIG. 11, the contact layer 107 (n-type GaAs layer) was processed to form openings with employing a mixture gas formed by mixing $BCl_3$ and $SF_6$ in a flow rate ratio of 3:1, under the condition of pressure: 0.5 Pa and microwave power: 70 W. Under this condition 100 times or more etching selection ratio of GaAs/AlGaAs was obtained.

(4)' In the process step shown in FIG. 12, with employing $SF_6$ gas, $SiO_2$ layer was processed under the condition of pressure: 0.1 Pa and microwave power: 200 W, to form the side wall insulation layer 113.

(5)' In the process step shown in FIG. 13, the threshold voltage controlling layer (n-type GaAs layer) 105 is etched with a mixture gas formed by mixing $BCl_3$ and $SF_6$ in a flow rate ratio of 3:1, under the condition of pressure: 0.5 Pa and microwave power: 70 W to expose the surface of the electron supply layer 104.

Figure 16:
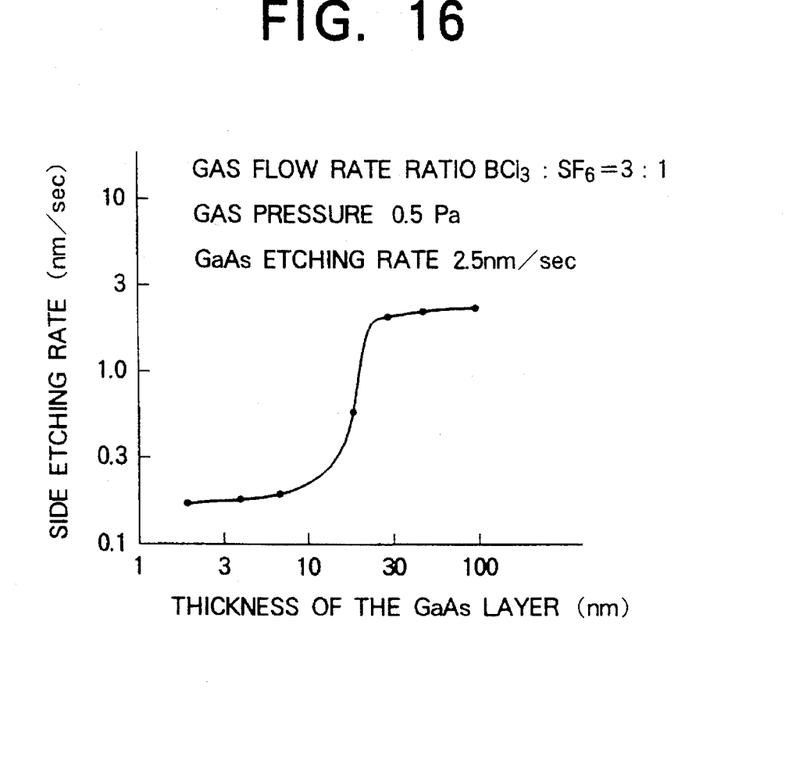
FIG. 16 is a graph showing a relationship between a layer thickness of GaAs layer as a body to be etched and a side etching speed, for explaining the effect of the second embodiment.

FIG. 16 is an illustration for demonstrating the effect of employment of ECR method of the shown conditions, in which is shown a relationship between the thickness of the GaAs layer on the AlGaAs layer and side etching rate of the GaAs layer. Here, the etching rate in the vertical direction (perpendicular direction) is maintained constant at 2.5 nm/second. On the other hand, the side etching rate (rate in the lateral direction) of the GaAs layer is substantially equal to that in the vertical direction when the layer thickness is large, and the etching rate ratio of lateral direction/vertical direction is 1.

However, when the thickness of the GaAs layer as the objective for etching is less than or equal to 20, the side etching rate is lowered to be 0.2 nm/second, the rate ratio of lateral direction to vertical direction is lowered to be 0.1 and thus lowered for one digit to have higher anisotropy. When the layer thickness becomes smaller than 15 nm, the lateral etching rate is restricted to be small enough to be ignored in practice. In the ECR method, since the etching pressure is low to be 0.5 Pa smaller than or equal to 1 Pa, in comparison with several Pa to several tens Pa in the RIE method, a mean free path of the plasma becomes longer to make anisotropy higher.

Here, when the gas pressure during etching is less than or equal to 1 Pa, satisfactory level anisotropy can be obtained. However, it is not desirable to lower the pressure less than or equal to 0.1 Pa. The reason is that such low pressure may lower the etching rate to increase sputtering characteristics to lower selectivity in etching.

Particularly, when the GaAs layer of the threshold valve controlling layer is thin to have a thickness of 4 nm as in the structure of the shown embodiment, progress of under-cut is small to have a margin in the etching period the gate electrode of the E-type element can be certainly buried in the threshold voltage controlling layer.

The square-law characteristics K value, $g_m$, the source resistance $R_s$ and threshold voltage $V_T$ of the E-type and D-type elements of 0.4 μm of gate length obtained by the shown embodiment were as follows:

E-type element: 560 mS/V mm, 490 mS/mm, 0.7 Ωmm, +0.2 V

D-type element: 360 mS/V mm, 380 mS/mm, 0.4 Ωmm, −0.5 V

In comparison with the case where treatment is performed by the RIE method in the former embodiment, the source resistance is lowered and K value and $g_m$ are improved in each element. This is considered as an effect of lesser damaging in the dry etching process and an effect of improvement of gate burying ability with restriction of under-cutting of the crystal in the E-type element.

Third Embodiment

Next, discussion will be given for the third embodiment of the invention. The section showing the construction of the shown embodiment of the compound semiconductor device and the fabrication process steps of the shown embodiment are similar to those of the first embodiment as illustrated in FIGS. 8 to 14. Therefore, these figures with be occasionally made reference to.

The shown embodiment employs a heat resistant Schottky type metal is employed as a material for forming the gate electrode, and is intended to reduce damage to be given during dry treatment and so forth. In the shown embodiment, the fabrication process is the same as that of the first embodiment up to the step (5) shown in FIG. 13. After completion of the process step (5) of FIG. 13, the photoresist layer 108b used as mask is removed. Then, cleaning is effected for the surface by oxygen plasma and organic washing.

(6)' Over the entire surface, the heat resistant Schottky type metal: $WSi_{0.6}$ to be the gate electrode is grown in a thickness of 0.1 μm, and W for lower resistance is grown thereover in the thickness of 0.5 μm, by way of sputtering growth. Subsequently, in nitrogen, heat treatment was performed at 500° C. for 30 minutes for recovering damage of crystal associated with sputtering growth and dry treatment. Thereafter, as shown in FIG. 14, the portion in the vicinity of the gate opening is covered with a photoresist layer, W/WSi layer is etched by RIE method employing fluorine type gas, such as $SF_6$ to form the gate electrodes 114 and 115. Thereafter, through the process similar to (7) of the first embodiment, the source and drain electrodes 116 to 119 are formed.

The square-law characteristics K value, $g_m$, the source resistance and the threshold voltage $V_T$ of the E-type and D-type elements of 0.4 μm of gate length, obtained through the third embodiment of the invention, were as follows:

E-type element: 600 mS/V mm, 530 mS/mm, 0.5 Ωmm, +0.2 V

D-type element: 410 mS/V mm, 420 mS/mm, 0.3 Ωmm, −0.5 V

Damage given in the heat treatment was recovered, the source resistance $R_s$ was further reduced, and K value and $g_m$ were improved.

Comparative Example 4

Selective crystal treatment of the E-type element after formation of the side wall insulation layer is performed by way of RIE method with employing $CCl_2F_2$ gas under the condition of pressure 5 Pa and self-bias voltage: 100 V, then similarly to the third embodiment, the gate metal of WSi—W was deposited by sputtering. Then, heat treatment was performed at 500° C. for 30 minutes. In this case, the characteristics of the E-type element was:

K value: 280 mS/V mm, $g_m$: 330 mS/mm, source resistance: 1.8 Ωmm, threshold voltage $V_T$: +0.3 V. K value, $g_m$ and source resistance $R_s$ are respectively degraded than those of the third embodiment. This is considered that when the crystal damage during dry treatment and so forth is significant, the recovery of damage is not effectively promoted by the heat treatment in the order of 500° C. Therefore, it is desirable to give damage in the dry treatment and so forth as small as possible.

Fourth Embodiment

Next, discussion will be given for the fourth embodiment with reference to FIG. 17. In the shown embodiment, n-type conductive layer having an etching stop layer is employed in the channel layer of the E-type and D-type elements, in place of the 2DEG. It should be noted that, in FIG. 17, since the reference numerals having common lower two digits to the corresponding elements in FIG. 8, redundant discussion will be neglected for avoiding redundant discussion for facilitating clear understanding of the invention.

Figure 17:
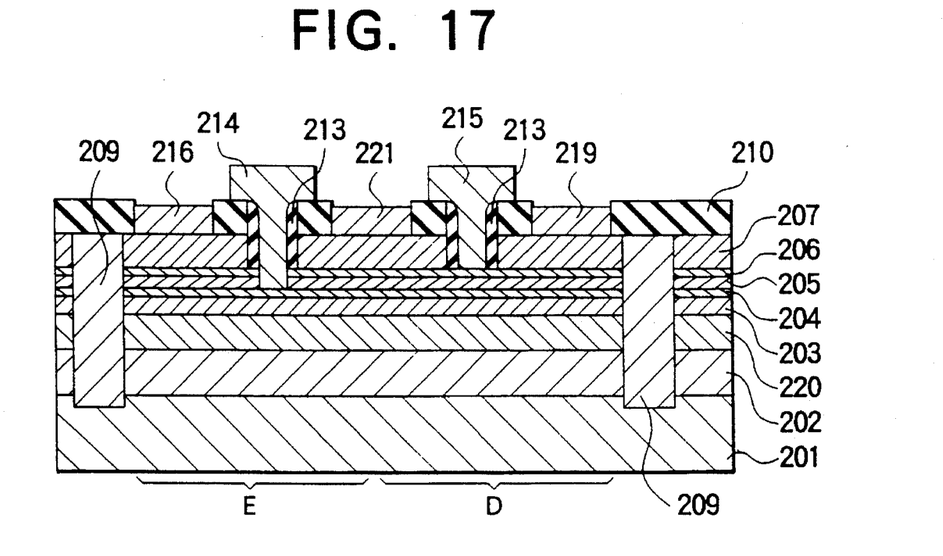
FIG. 17 is a section for explaining the second embodiment of the compound semiconductor device according to the invention.

As shown in FIG. 17, on a semi-insulative GaAs substrate 201, undoped GaAs layer as a buffer layer 202 in a thickness of 400 nm, p-type $Al_{0.15}Ga_{0.85}As$ layer as the p-type buried layer 220 in a thickness of 100 nm and p-type donor density of $1\times10^{16}$ cm$^-$, n-type GaAs layer as n-type conductive layer 203 in a thickness of 20, n-type $Al_{0.20}Ga_{0.80}As$ layer as etching stop layer 204 in a thickness of 3 nm, n-type GaAs layer as a threshold voltage controlling layer 205 in a thickness of 5 nm, n-type $Al_{0.20}Ga_{0.80}As$ layer as etching stop layer 206 in a thickness of 3 nm, and n-type GaAs layer as a contact layer in a thickness of 25 nm are formed by epitaxial growth process. The donor density at each n-type layer is common at $2\times10^{18}$ cm$^{-3}$. Here, the n-type conductive layer 203 and the etching stop layer 204 correspond to the first conductive semiconductor group and the threshold voltage controlling layer 205 and the etching stop layer 206 correspond to the second conductive semiconductor group.

The Schottky type gate electrodes 214 and 215 are formed with a laminated layer of 100 nm thickness of WSi and 500 thickness of W, with a gate length of 0.4 μm. Ohmic type source electrode 216, drain electrode 219, source/drain electrode 221 are formed of AuGeNi alloy layer. Here, the drain of the E-type element and the drain of the D-type element ar common to form an inverter construction with both elements.

The fabrication process showing in the embodiment of FIG. 17 is substantially the same as the second embodiment. Namely, the ECR method is employed for dry treatment. Selective crystal treatment of the E-type element is stopped at the AlGaAs layer as the etching stop layer 204. However, the gate electrode is formed of WSi—W on the entire surface by way of sputtering deposition. In the nitrogen, heat treatment is performed at 500° C. for 30 minutes. Then, the WSi—W layer is treated to form the gate electrode.

The K value, $g_m$, the source resistance and the threshold voltage $V_T$ of the E-type and D-type elements with 0.4 μm of gate length, obtained through the fourth embodiment were as follows:

E-type element: 370 mS/V mm, 380 mS/mm, 0.6 Ωmm, +0.2 V,

D-type element: 320 mS/V mm. 360 mS/mm, 0.4 Ωmm, −0.5 V,

Since 2DEG is not employed as the channel, K value and $g_m$ are lower than the first embodiment. However, low source resistance $R_s$ can be obtained at respective elements at low cost. Therefore, the present invention is superior in comparison with the conventional fabrication process.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fabrication process of a compound semiconductor device comprising:

a first step of sequentially growing a first conductive type semiconductor layer group, a second conductive semiconductor layer group and a low resistance conductive semiconductor layer on a semi-insulative semiconductor substrate in order;

a second step of forming a first insulation layer on said low resistance conductive semiconductor layer and forming first and second gate openings by selectively etching said first insulation layer;

a third step of selectively etching said low resistance conductive semiconductor layer exposed by said first and second gate openings formed in said first insulation layer to expose the surface of said second conductive semiconductor layer group to form third and fourth gate openings continuous to said first and second gate openings;

a fourth step of forming a side wall insulation layer in a side wall of said first to fourth gate openings by depositing second insulation layer on entire surface and by etching back said second insulation layer;

a fifth step of selectively etching said second conductive semiconductor layer group exposed through said third gate opening with masking the second and fourth gate openings to expose the surface of said first conductive semiconductor layer group to form a fifth gate opening continuous to said third gate opening; and a sixth step of forming a first gate electrode contacting with the surface of said first conductive semiconductor layer group via said first, third and fifth gate openings and with a side surface of the second conductive semiconductor layer group, and a second gate electrode contacting with said second conductive semiconductor layer group via said second and fourth gate openings.

2. A fabrication process of a compound semiconductor device as set forth in claim 1, wherein said second conductive semiconductor layer group includes a threshold value voltage controlling layer in a thickness less than or equal to 15 as a lower layer, and an etching stop layer for stopping etching upon etching of said lower resistance conductive semiconductor layer as an upper layer, and said fifth step includes a selective etching step for said etching stop layer and an isotropic dry etching step for said threshold voltage controlling layer.

3. A fabrication process of a compound semiconductor device as set forth in claim 2, wherein said second conductive semiconductor layer group includes a threshold value voltage controlling layer in a thickness less than or equal to 15 nm as a lower layer, and an etching stop layer for stopping etching upon etching of said lower resistance conductive semiconductor layer as an upper layer, and said fifth step includes a selective etching step for said etching stop layer and an etching step for said threshold voltage controlling layer performed by generating a plasma by an electron cyclotron resonance.

4. A fabrication process of a compound semiconductor device as set forth in claim 2, wherein, said etching stop layer is an AlGaAs layer, and said threshold voltage controlling layer is an GaAs layer.

5. A fabrication process of a compound semiconductor device as set forth in claim 3, wherein, said etching stop layer is an AlGaAs layer, and said threshold voltage controlling layer is an GaAs layer.

* * * * *